United States Patent
Chen et al.

(10) Patent No.: US 8,723,265 B2
(45) Date of Patent: May 13, 2014

(54) SEMICONDUCTOR STRUCTURE WITH DUMMY POLYSILICON LINES

(75) Inventors: Yen-Huei Chen, Jhudong Township (TW); Wei Min Chan, Sindian (TW); Shao-Yu Chou, Chu-Pei (TW); Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 220 days.

(21) Appl. No.: 13/158,133

(22) Filed: Jun. 10, 2011

(65) Prior Publication Data

US 2012/0313177 A1 Dec. 13, 2012

(51) Int. Cl.
*H01L 21/70* (2006.01)
*H01L 27/32* (2006.01)

(52) U.S. Cl.
CPC ................................. *H01L 27/3223* (2013.01)
USPC ........................................................ 257/368

(58) Field of Classification Search
CPC .................................................. H01L 27/3223
USPC ........................................................ 257/368
See application file for complete search history.

(56) References Cited

U.S. PATENT DOCUMENTS

| | | | | |
|---|---|---|---|---|
| 2001/0009527 | A1* | 7/2001 | Tanzawa et al. | 365/207 |
| 2003/0146455 | A1* | 8/2003 | Abedifard | 257/213 |
| 2005/0009312 | A1* | 1/2005 | Butt et al. | 438/587 |
| 2008/0001169 | A1* | 1/2008 | Lochtefeld | 257/190 |
| 2009/0108290 | A1* | 4/2009 | Yu et al. | 257/190 |
| 2010/0052065 | A1* | 3/2010 | Diaz et al. | 257/369 |

FOREIGN PATENT DOCUMENTS

JP 01235098 A * 9/1989

* cited by examiner

*Primary Examiner* — Ajay K Arora
(74) *Attorney, Agent, or Firm* — Slater & Matsil, L.L.P.

(57) ABSTRACT

A multiple finger structure comprises a plurality of active regions placed between a pair of dummy POLY lines. The active regions comprise a plurality of multiple fingered NMOS transistors, which are part of a sense amplifier of an SRAM memory circuit. The drain and source of each multiple fingered NMOS transistor have an SiP/SiC epitaxial growth region. The active regions extend and overlap with the dummy POLY lines. The overlap between the active regions and the dummy POLY lines helps to reduce edge imperfection at the edge of the active regions.

20 Claims, 4 Drawing Sheets

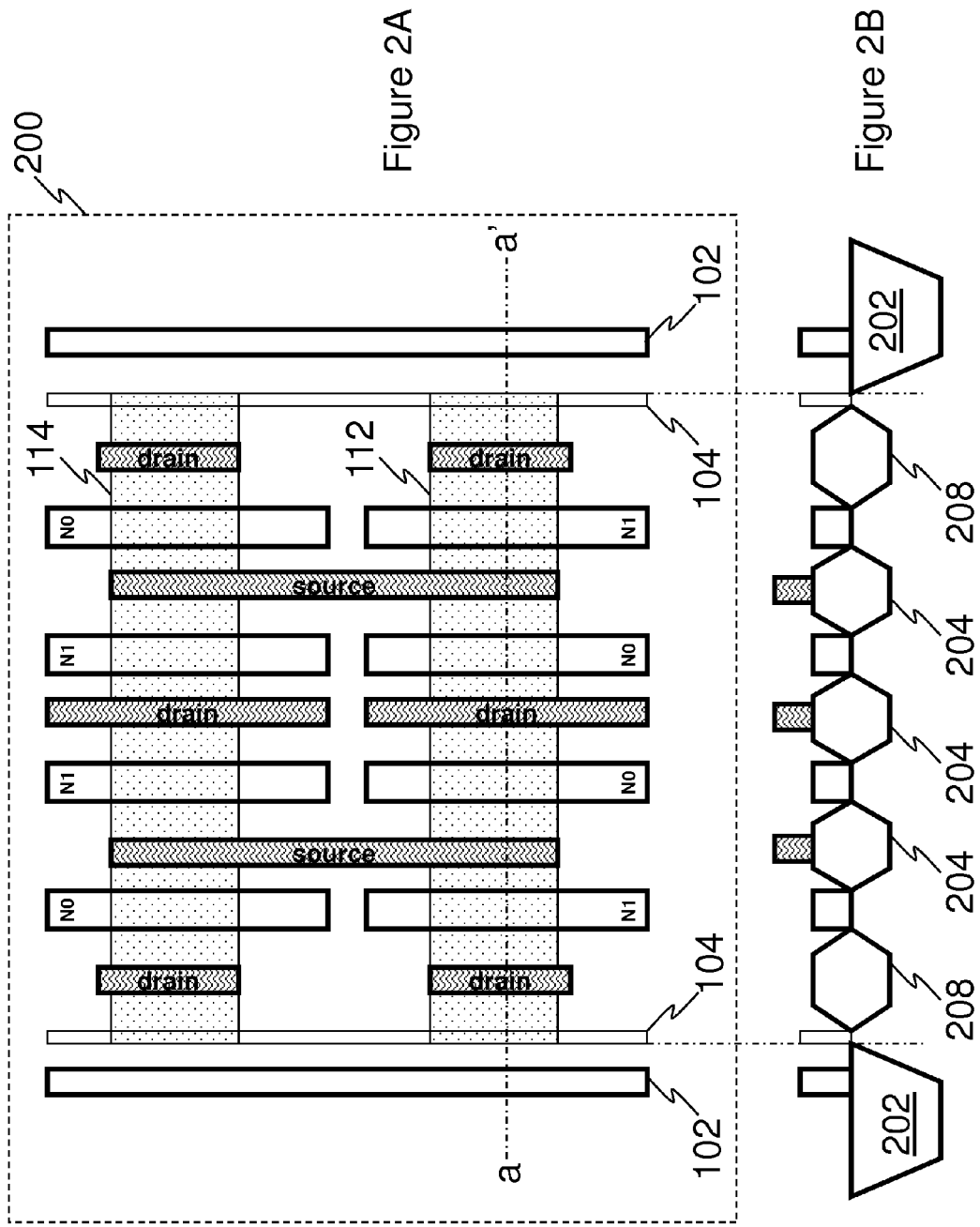

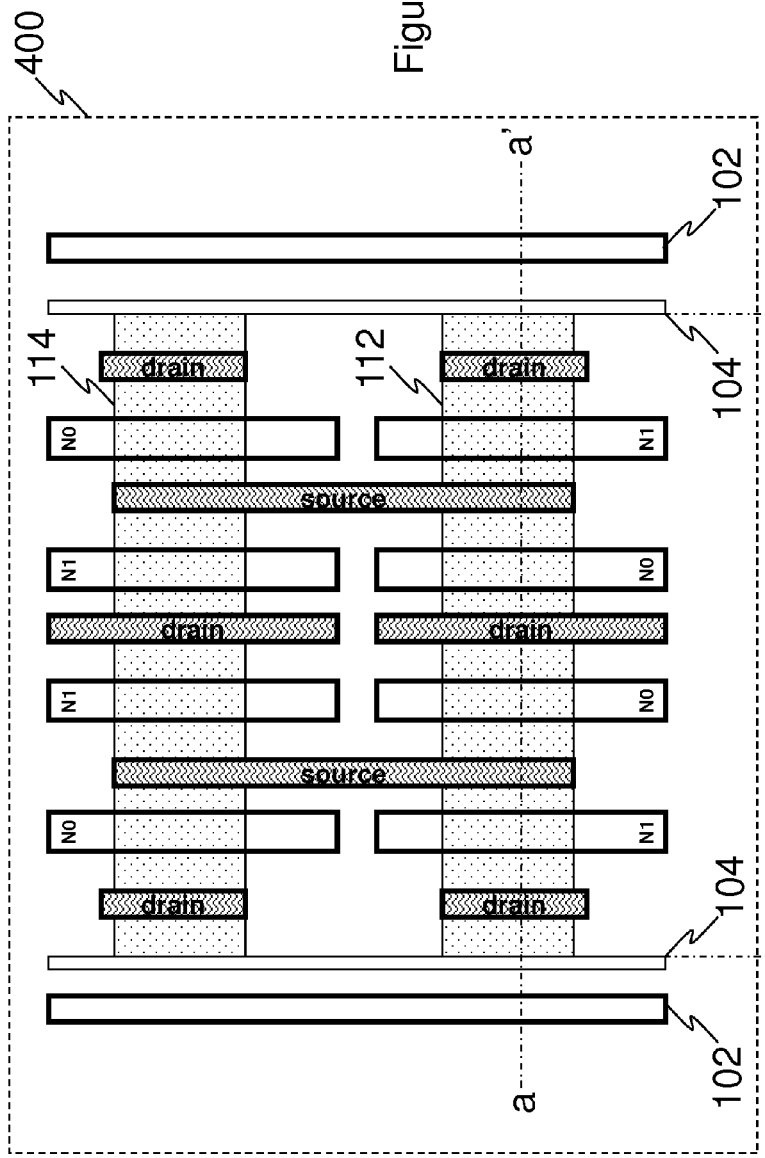

US 8,723,265 B2

SEMICONDUCTOR STRUCTURE WITH DUMMY POLYSILICON LINES

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them permanently unless an electrical charge is applied to non-volatile memories. Non-volatile memories include a variety of sub-categories, such as electrically erasable programmable read-only memory (EEPROM) and flash memory.

SRAM cells may comprise different numbers of transistors. According to the total number of transistors in an SRAM cell, the SRAM cell may be referred to as a six-transistor (6-T) SRAM, an eight-transistor (8-T) SRAM, and the like. SRAM cells are arranged in rows and columns. An SRAM cell is selected during either a READ operation or a WRITE operation by selecting its row and column. During a READ operation, through a turned on pass-gate transistor, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and $\overline{BL}$ (approximately in a range from 50 to 100 mV) is detected by a sense amplifier. Furthermore, the sense amplifier amplifies the differential voltage to a logic state level and reports the logic state of the memory cell via a data buffer.

A sense amplifier may comprise a pair of cross-coupled inverters. During a read operation of an SRAM memory cell, the outputs of the cross-coupled inverters are pre-charged to the operating voltage of the SRAM memory cell. Subsequently, an output of a first inverter is discharged when the sense amplifier is enabled. As cross-coupled inverters, the output of the first inverter is coupled to the input of a second inverter. Thus, the discharge of the output of the first inverter may cause the current flowing into the second inverter less than that in the first inverter. As a result, the output of the second inverter is higher than that of the first inverter. Such a higher voltage further causes an increase of the current flowing into the first inverter. As such, the cross-coupled inverters form a positive feedback system in which the differential voltage between two bit lines of a memory cell is amplified to a logic state level.

A mismatch between the first inverter and the second inverter may cause the sense amplifier entering a failure mode. For example, due to process and operation variations, there may be a mismatch between the first and second inverters. As a result, the positive feedback scheme described in the previous paragraph may enter into a wrong direction. In order to reduce the mismatch of sense amplifiers, various solutions such as a symmetric layout of the first and the second inverter have been employed in the design of sense amplifiers.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates a top view of a multiple finger structure in accordance with an embodiment;

FIG. 2B illustrates a cross sectional view of the multiple finger structure shown in FIG. 3A;

FIG. 4A illustrates a top view of another multiple finger structure in accordance with yet another embodiment; and FIG. 4B illustrates a cross sectional view of the multiple finger structure shown in FIG. 4A.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a multiple finger structure for a sense amplifier in a static random access memory (SRAM) memory circuit. The invention may also be applied, however, to a variety of memory circuits.

Figures 1A, 1B:
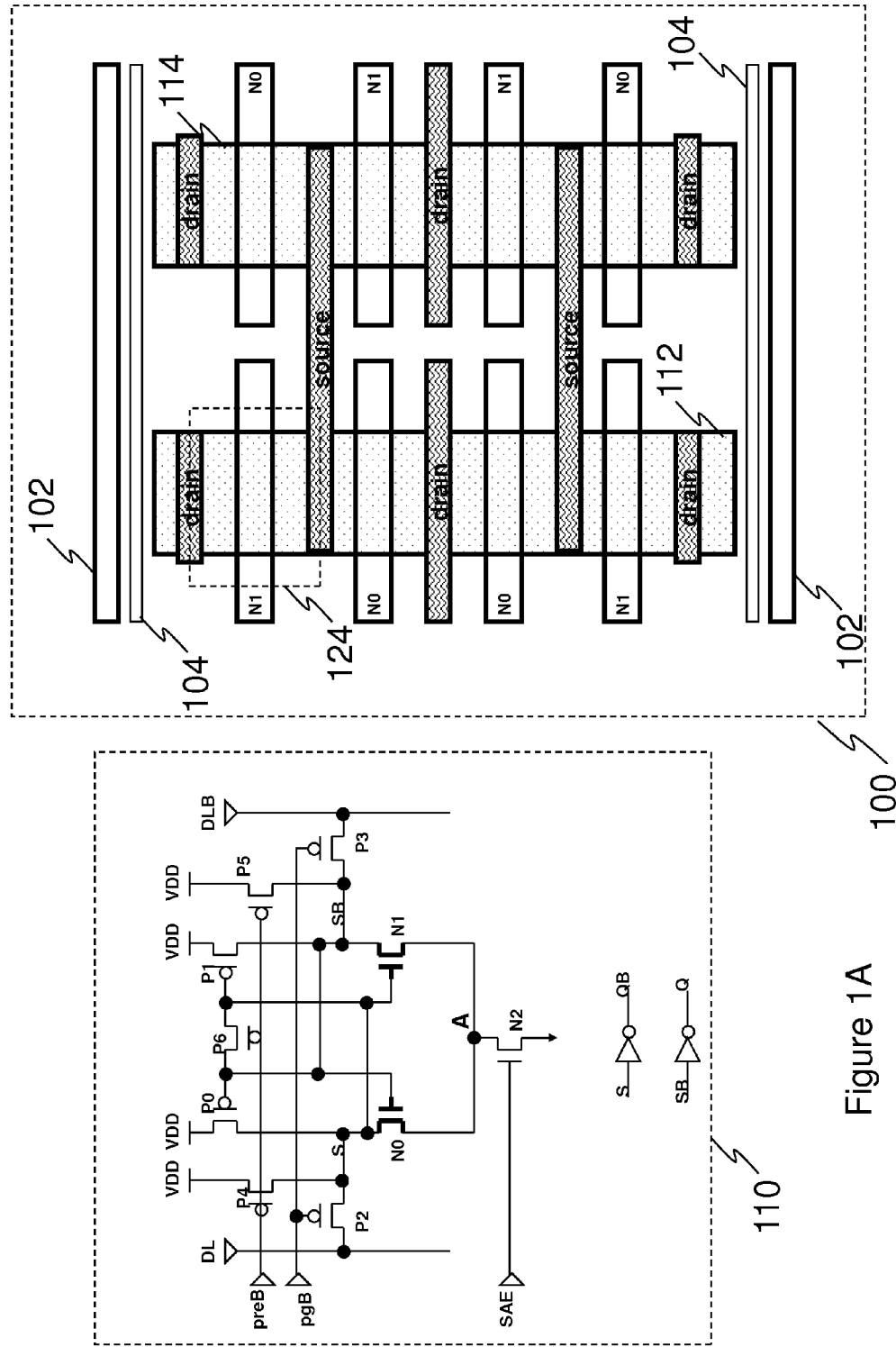
FIG. 1A illustrates a schematic diagram of a sense amplifier in accordance with an embodiment.
FIG. 1B illustrates a top view of a multiple finger structure of a pair of n-type metal oxide semiconductor (NMOS) transistors in accordance with an embodiment.

Referring initially to FIG. 1, a schematic diagram of a sense amplifier is illustrated in FIG. 1A in accordance with an embodiment. The sense amplifier 110 comprises a pair of cross-coupled inverters. More particularly, the first inverter is formed by a first p-type metal oxide semiconductor (PMOS) transistor P0 and a first n-type metal oxide semiconductor (NMOS) transistor N0 connected in series. The second inverter is formed by a second PMOS transistor P1 and a second NMOS transistor N1 connected in series. As shown in FIG. 1A, the input of the first inverter is coupled to the output of the second inverter. Likewise, the input of the second inverter is coupled to the output of the first inverter. The sense amplifier 110 further comprises two pre-charge PMOS transistors P4 and P5 connected between a voltage potential VDD and the output of the first inverter and the output of the second inverter respectively. The sense amplifier 110 may further comprise a plurality of controllable switches such as PMOS transistor P2, PMOS transistor P3, NMOS transistor N2 and PMOS transistor P6. In response to various control signals such as sense amplifier enable signal SAE, the controllable switches either connect the cross-coupled inverters with external signals or isolate the cross-coupled inverters from external circuits. The operation details of each controllable switch are well known, and hence are not discussed in detail herein.

During a read operation of an SRAM memory cell (not shown), the outputs of the first inverter and the second inverter are pre-charged to the voltage potential VDD through the turned on PMOS transistors P4 and P5. Subsequently, both PMOS transistors P2 and P3 are turned on and the signals on the data lines DL and $\overline{DL}$ are connected to the inputs of the first inverter and the second inverter respectively. As known in the art, the logic state on the data line DL is opposite to that on the data line $\overline{DL}$. For example, assume that the data line DL is coupled to a storage node having a logic low state. As soon as the leading edge of the sense amplifier enable signal SAE arrives, the NMOS transistor N2 conducts and the output of the first inverter as well as the input of the second inverter are discharged by the logic low state on the data line DL. The discharge of the gate of the NMOS transistor N1 causes the current flowing into the second inverter less than that in the first inverter. As a result, the output of the second inverter is higher than that of the first inverter. Such a higher voltage further causes an increase of the current flowing into the first inverter. As such, the cross-coupled inverters form a positive feedback system in which the sense amplifier 110 generates an output signal proportional to the difference between the data line DL and the data line $\overline{DL}$.

The sense amplifier 110 is capable of amplifying a small differential voltage between the data line DL and the data line $\overline{DL}$ to a logic level. However, a mismatch between the NMOS transistor N0 and the NMOS transistor N1 may cause the sense amplifier 110 to report a logic state incorrectly. For example, due to process and operation variations, there may be a mismatch between the turn-on thresholds of the NMOS transistor N0 and the NMOS transistor N1. As a result, the positive feedback scheme described in the previous paragraph may enter into a wrong direction. Considering the example in the previous paragraph again, the sense amplifier 110 may not report a correct logic state when the threshold mismatch exists. For example, when the threshold of the NMOS transistor N0 is higher than that of the NMOS transistor N1. Even the discharge at the gate of NMOS transistor N1 causes the NMOS transistor N0 to have a higher gate voltage than that of the NMOS transistor N0. The higher threshold of the NMOS transistor N0 may cause a higher current flowing through the second inverter. As a result, the positive feedback formed by the cross-coupled inverters may enter an opposite direction in comparison with the example shown in the previous paragraph. There may be a variety of methods for solving the mismatch between two NMOS transistors of a sense amplifier. Among them, a multiple finger structure is an effective way to prevent a mismatch from occurring at cross-coupled inverters due process and operation variations.

FIG. 1B illustrates a top view of a multiple finger structure of a pair of NMOS transistors in accordance with an embodiment. The multiple finger structure 100 comprises two active regions. Active regions are alternatively referred to as oxide definition (OD) regions. Throughout the description, OD regions stand for active regions hereinafter. The OD region 112 and the OD region 114 are placed in parallel. The multiple finger structure 100 may comprise a first dummy polysilicon (POLY) line 102 and second dummy POLY line 104 placed next to each other on both sides of the OD regions 112 and 114. As known in the art, dummy POLY lines 102 and 104 do not form gate electrodes of any transistor, and may be floating when the multiple finger structure is active.

On top of the OD region 112, there may be four active POLY lines, namely N1, N0, N0 and N1. In accordance with an embodiment, each active POLY line functions as a gate electrode of a multiple fingered transistor. It should be noted that while the disclosure selects a POLY gate electrode, the gate electrode can be formed by other conductive materials such as metals, metal silicides or the like. Furthermore, there may be a variety of metal-0 layers placed on top of the OD region 112. As shown in FIG. 1B, the variety of metal-0 layers function as contacts for either a drain terminal or a source terminal of a transistor. For example, on the upper left corner of FIG. 1B, a first metal-0 layer is a contact of a drain and a second metal-0 layer is a contact of a source. An N1 POLY line is placed between the first metal-0 layer and the second metal-0 layer. As known in the art, the first metal-0 layer, the N1 POLY line and the second metal-0 layer form a multiple fingered NMOS transistor as indicated by a dashed rectangle 124. As shown in FIG. 1B, the rest N1 POLY lines and adjacent metal-0 layers form other multiple fingered NMOS transistors. All N1 POLY line based NMOS transistors are connected in parallel so as to form the NMOS transistor N1 shown in FIG. 1A. Likewise, all N0 POLY lines and adjacent metal-0 layers form a plurality of multiple fingered NMOS transistors connected in parallel. Similarly, all N0 POLY line based NMOS transistors form the NMOS transistor N0 shown in FIG. 1A. One advantageous feature of having a multiple finger structure to implement the NMOS transistors of a sense amplifier is that the symmetric layout of the NMOS transistor N0 and the NMOS transistor N1 may cancel out or minimize parameter shifts due to operation and process variations.

FIG. 2A illustrates a top view of a multiple finger structure in accordance with an embodiment. The majority of the multiple finger structure 200 is similar to that of the multiple finger structure 100 shown in FIG. 1B except that the dummy POLY lines 104 overlaps the OD regions 112 and 114. In comparison with the multiple finger structure 100, the OD regions 112 and 114 in FIG. 2 extend into the dummy POLY line regions and overlap with the dummy POLY lines 104. As shown in FIG. 2, both edges of the OD region 114 are underneath the dummy POLY lines 104. Likewise, both edges of the OD region 112 are underneath the dummy POLY lines 104. The overlap between the OD regions and the dummy POLY lines may improve the mismatch between the NMOS transistor N0 and the NMOS transistor N1. The details of the improvement will be illustrated below with respect to FIG. 2B.

It should be noted that in order to avoid layout versus schematic (LVS) errors, the attribute of the dummy POLY lines 104 should be incorporated into the design of the multiple finger structure 200. More particularly, the dummy status of the dummy POLY lines 104 may be specifically labeled so that the LVS program will not recognize the structure formed by dummy POLY lines 104 on top of an OD region as an active transistor.

The cross sectional view in FIG. 2B is obtained from the plane crossing line a-a' shown in FIG. 2A. The cross sectional view illustrates an OD region formed between two isolation regions 202. In an exemplary embodiment, the isolation regions 202 are shallow trench isolation (STI) regions. The cross section view further illustrates a plurality of phosphorous doped Si (SiP) or silicon carbide (SiC) epitaxial growth regions. Depending on the location, the plurality of SiP/SiC epitaxial growth regions can be further divided into two types. The first epitaxial growth regions 204 are located in the middle of the OD region. The second epitaxial growth regions 206 are located next to the edges of the OD region. As shown in FIG. 2B, both the first epitaxial growth regions 204 and the second epitaxial growth regions 206 have the similar hexagon shape. The similar hexagon shape helps multiple fingered NMOS transistors located at different portions of the OD regions have the similar performance parameters so that the mismatch between the NMOS transistor N0 and the NMOS transistor N1 of the sense amplifier 110 can be reduced.

On the other hand, if the OD regions (e.g., 112) do not overlap the dummy POLY lines 104, the epitaxial growth regions 206 may have an irregular shape because of edge imperfection commonly occurring in semiconductor fabrication processes. For example, the epitaxial growth regions 206 may have a triangular shape or other unknown or unpredictable shapes. Such irregular shapes may cause the multiple fingered transistors located at the edge of the OD region have different performance parameters from those located in the middle of the OD region. As a result, the NMOS transistor N0 and the NMOS transistor N1 may have a mismatch, which may further cause a logic failure at the sense amplifier 110 (not shown but illustrated in FIG. 1A).

Figure 3A:
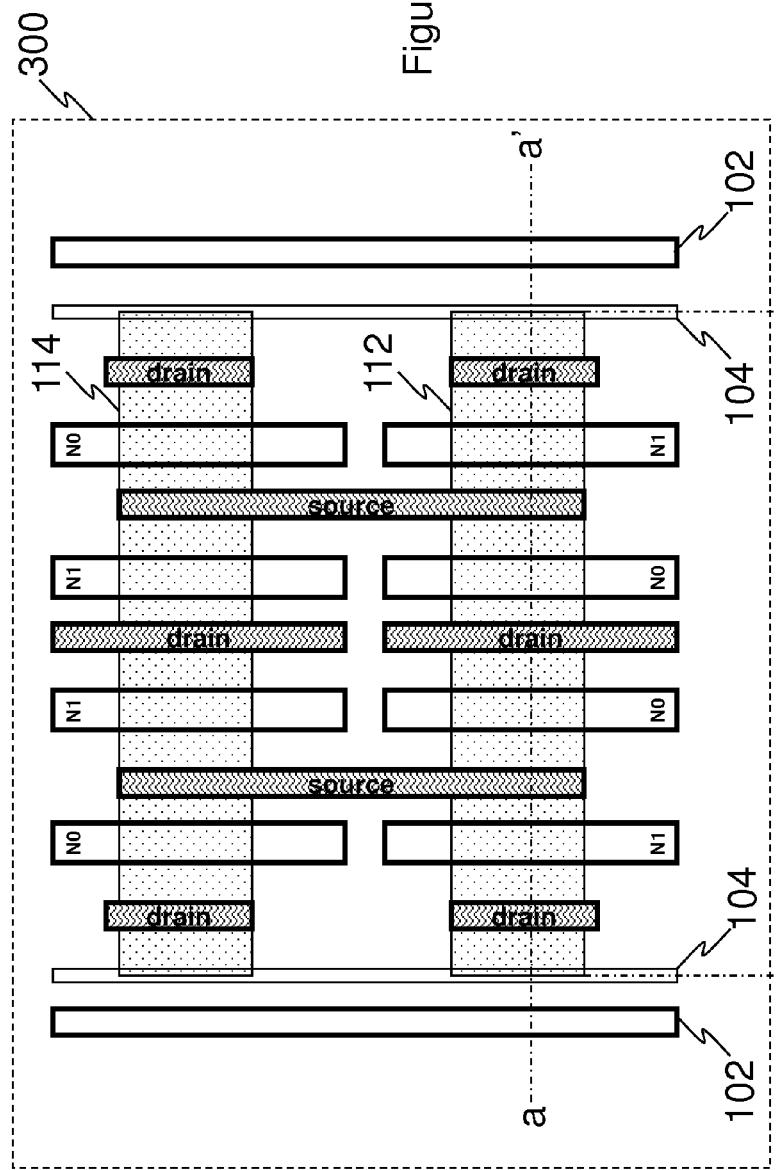
FIG. 3A illustrates a top view of another multiple finger structure in accordance with another embodiment.

FIG. 3A illustrates a top view of another multiple finger structure in accordance with another embodiment. The majority portion of multiple finger structure 300 shown in FIG. 3A is similar to the multiple finger structure 200 shown in FIG. 2A, and hence is not discussed in detail to avoid repetition. The difference between FIG. 3A and FIG. 2A is that the edges of active regions 112 and 114 in FIG. 3A are located at a point between the left edge and the right edge of dummy POLY lines 104. It should be noted that while FIG. 3A illustrated that the edges of the active regions 112 and 114 extend and stop at a middle point between the left edge and the right edge of the dummy POLY lines 104, the edges of the active regions 112 and 114 can be located at any points between the left edge and the right edge of the dummy POLY lines 104.

Figure 3B:
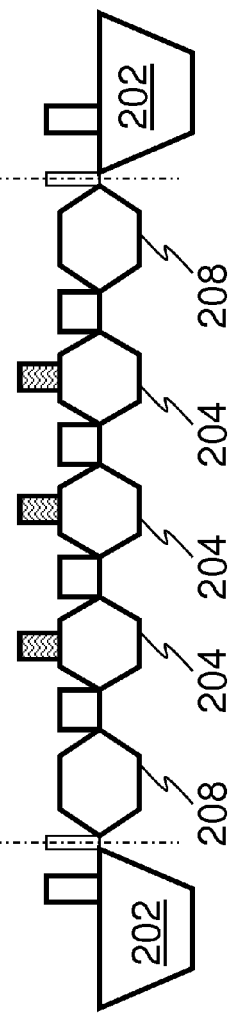
FIG. 3B illustrates a cross sectional view of the multiple finger structure shown in FIG. 3A.

FIG. 3B illustrates a cross sectional view of the multiple finger structure shown in FIG. 3A. The advantages of having dummy POLY lines overlapping with active regions have been discussed above with respect to FIG. 2B, and hence are not discussed in further detail herein. As shown in FIG. 3B, the dashed line depicts that the dummy POLY lines 104 partially overlap the edges of the OD regions 112 and 114. Similar to FIG. 2B, the multiple finger structure 300 has hexagon shaped epitaxial growth regions. Such hexagon shaped epitaxial regions, especially the epitaxial regions at both edges of the OD regions help to reduce the mismatch between two cross-coupled inverters of the sense amplifier 110 (not shown but illustrated in FIG. 1A).

FIG. 4A illustrates a top view of another multiple finger structure in accordance with yet another embodiment. The majority portion of the multiple finger structure 400 shown in FIG. 4A is similar to the multiple finger structure 200 shown in FIG. 2A, and hence is not discussed in detail to avoid repetition. The difference between FIG. 4A and FIG. 2A is that the edges of active regions 112 and 114 in FIG. 4A are not underneath the dummy POLY lines 104. Instead, the edges of active regions 112 and 114 touch the edges of the dummy POLY lines 104. FIG. 4B illustrates a cross sectional view of the multiple finger structure shown in FIG. 4A. Although FIG. 4B shows active regions 112 and 114 are not underneath the dummy POLY lines 104, the second epitaxial growth regions 206 have the same hexagon shape as the first epitaxial growth regions 204. The advantages of having the same shape of the first epitaxial growth region and the second epitaxial growth region have been discussed above with respect to FIG. 2B, and hence are not discussed in further detail herein.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
    a first dummy polysilicon (POLY) line;
    a second dummy POLY line; and
    an active region located between and overlapping at least a portion of the first dummy POLY line and the second dummy POLY line comprising:
        a plurality of epitaxial growth regions, wherein a leftmost epitaxial growth region is of a hexagon shape and has a left edge touching the first dummy POLY line, and a rightmost epitaxial growth region is of the hexagon shape and has a right edge touching the second dummy POLY line;
        a first edge touching the first dummy POLY line; and
        a second edge touching the second dummy POLY line.

2. The structure of claim 1, wherein the first edge touches a left edge of the first dummy POLY line and the second edge touches a right edge of the second dummy POLY line, wherein the first dummy POLY line is on a left side of the active region and the second dummy POLY line is on a right side of the active region.

3. The structure of claim 1, wherein the first edge touches a right edge of the first dummy POLY line and the second edge touches a left edge of the second dummy POLY line, wherein the first dummy POLY line is on a left side of the active region and the second dummy POLY line is on a right side of the active region.

4. The structure of claim 1, wherein the first edge is located between a left edge of the first dummy POLY line and a right edge of the first dummy POLY line.

5. The structure of claim 1, wherein the second edge is located between a left edge of the second dummy POLY line and a right edge of the second dummy POLY line.

6. The structure of claim 1, further comprising:
    a plurality of hexagon shaped phosphorous doped Si (SiP) or silicon carbide (SiC) epitaxial growth regions located in the active region;
    a first edge hexagon shaped SiP or SiC epitaxial growth region next to the first edge; and
    a second hexagon shaped SiP or SiC epitaxial growth region next to the second edge.

7. The structure of claim 1, wherein a pair of multiple fingered n-type metal oxide semiconductor (NMOS) transistors are formed in the active region.

8. A system comprising:
    a first dummy polysilicon (POLY) line;
    a second dummy POLY line;
    a first active region located between and overlapping at least a portion of the first dummy POLY line and the second dummy POLY line comprising:
        a plurality of first epitaxial growth regions, wherein a leftmost first epitaxial growth region is of a hexagon shape and has a left edge touching the first dummy POLY line, and a rightmost first epitaxial growth region is of the hexagon shape and has a right edge touching the second dummy POLY line;

a first edge touching the first dummy POLY line; and
a second edge touching the second dummy POLY line; and
a second active region located between the first dummy POLY line and the second dummy POLY line comprising:
a plurality of second epitaxial growth regions, wherein a leftmost second epitaxial growth region is of the hexagon shape and has a left edge touching the first dummy POLY line, and a rightmost second epitaxial growth region is of the hexagon shape and has a right edge touching the second dummy POLY line;
a first edge touching the first dummy POLY line; and
a second edge touching the second dummy POLY line.

9. The system of claim 8, further comprising:
a plurality of POLY lines, each of which forms a gate electrode of a multiple fingered n-type metal oxide semiconductor (NMOS) transistor; and
a plurality of contact layers, each of which forms a drain or a source contact of the multiple fingered NMOS transistor.

10. The system of claim 9, wherein a POLY line and two adjacent contact layers form a multiple fingered NMOS transistor.

11. The system of claim 10, wherein the multiple fingered NMOS transistor comprises:
a gate formed by a POLY line;
a drain having a phosphorous doped Si (SiP) or silicon carbide (SiC) epitaxial region; and
a source having an SiP or SiC epitaxial growth region.

12. The system of claim 8, further comprising a first group of multiple fingered NMOS transistors and a second group of multiple fingered NMOS transistors formed symmetrically on the first active region and the second active region.

13. The system of claim 12, wherein the first group of multiple fingered NMOS transistors and the second group of multiple fingered NMOS transistors are configured such that:
the first group of multiple fingered NMOS transistors are connected in parallel and form a first NMOS transistor; and
the second group of multiple fingered NMOS transistors are connected in parallel and form a second NMOS transistor.

14. The system of claim 13, wherein the first NMOS transistor and the second NMOS transistor form a sense amplifier.

15. A method comprising:
forming a first dummy polysilicon (POLY) line touching a left edge of a first active region;
forming a second dummy POLY line touching a right edge of the first active region; and
forming the first active region located between and overlapping at least a portion of the first dummy POLY line and the second dummy POLY line, wherein:
the first active region comprises a plurality of epitaxial growth regions, wherein a leftmost epitaxial growth region is of a hexagon shape and has a left edge touching the first dummy POLY line, and a rightmost epitaxial growth region is of the hexagon shape and has a right edge touching the second dummy POLY line.

16. The method of claim 15, further comprising:
forming a second active region between the first dummy POLY line and the second dummy POLY line;
forming a left edge of the second active region touching the first dummy POLY line; and
forming a right edge of the second active region touching the second dummy POLY line.

17. The method of claim 16, further comprising:
forming a plurality of multiple fingered n-type metal oxide semiconductor (NMOS) transistors in the first active region; and
forming a plurality of multiple fingered NMOS transistors in the second active region.

18. The method of claim 16, further comprising:
forming a first group of multiple fingered NMOS transistors in the first active region and the second active region;
forming a second group of multiple fingered NMOS transistors in the first active region and the second active region;
connecting the first group of multiple fingered NMOS transistors in parallel to form a first NMOS transistor;
connecting the second group of multiple fingered NMOS transistors in parallel to form a second NMOS transistor; and
forming a sense amplifier by the first NMOS transistor and the second NMOS transistor.

19. The method of claim 15, further comprising:
forming a plurality of active POLY lines on top of the first active region;
forming a plurality of contact layers on top of the first active region; and
forming a plurality of isolation regions on top of the first active region.

20. The method of claim 19, further comprising:
forming a gate electrode of a multiple fingered NMOS transistor by an active POLY line of the plurality of active POLY lines;
forming a drain by a first contact layer adjacent to the active POLY line;
forming a source by a second contact layer adjacent to the active POLY line; and
forming a multiple fingered NMOS transistor by the gate electrode, the drain and the source.

* * * * *